US012246931B2

(12) United States Patent
Wu et al.

(10) Patent No.: US 12,246,931 B2
(45) Date of Patent: Mar. 11, 2025

(54) WAFER TRANSFER DEVICE AND WAFER TRANSFER METHOD

(71) Applicant: SHENYANG KINGSEMI Co., Ltd., Shenyang (CN)

(72) Inventors: Tianyao Wu, Shenyang (CN); Hao Wang, Shenyang (CN); Xinglong Chen, Shenyang (CN); Tao Miao, Shenyang (CN)

(73) Assignee: SHENYANG KINGSEMI Co., Ltd., Shenyang (CN)

( * ) Notice: Subject to any disclaimer, the term of this patent is extended or adjusted under 35 U.S.C. 154(b) by 395 days.

(21) Appl. No.: 17/636,154

(22) PCT Filed: Sep. 24, 2021

(86) PCT No.: PCT/CN2021/120096
§ 371 (c)(1),
(2) Date: Feb. 17, 2022

(87) PCT Pub. No.: WO2023/024208
PCT Pub. Date: Mar. 2, 2023

(65) Prior Publication Data
US 2023/0339706 A1 Oct. 26, 2023

(30) Foreign Application Priority Data
Aug. 27, 2021 (CN) .......................... 202110996215.3

(51) Int. Cl.
*B65G 49/06* (2006.01)
(52) U.S. Cl.
CPC ......... *B65G 49/061* (2013.01); *B65G 49/067* (2013.01); *B65G 2201/0297* (2013.01)
(58) Field of Classification Search
CPC ............... B65G 49/061; B65G 49/067; B65G 2201/0297; H01L 21/6838;
(Continued)

(56) References Cited

U.S. PATENT DOCUMENTS 8,545,118 B2 * 10/2013 Ogura ............... H01L 21/67201
396/611
9,252,034 B2 * 2/2016 Lee ...................... B65G 49/067
(Continued)

FOREIGN PATENT DOCUMENTS

| CN | 102763210 B |   | 8/2015 |            |
|----|-------------|---|--------|------------|
| CN | 110085534 A | * | 8/2019 |            |
| CN | 210272293 U | * | 4/2020 | ... G03F 7/16 |

*Primary Examiner* — David S Posigian
*Assistant Examiner* — Michael A Gump
(74) *Attorney, Agent, or Firm* — Ziegler IP Law Group, LLC.

(57) ABSTRACT

The present invention provides a wafer transfer device. The wafer transfer device comprises a first supporting mechanism and a second supporting mechanisms, wherein the first supporting mechanism and the second supporting mechanism are arranged side by side along a translation direction, and two opposite outer side walls of the first supporting mechanism and the second supporting mechanism are each provided with a picking-conveying guide structure arranged along a telescopic direction perpendicular to the translation direction; a first picking-conveying mechanism and a second picking-conveying mechanism which are movably arranged at the picking-conveying structure of the first supporting mechanism and the picking-conveying guide structure of the second supporting mechanism respectively, wherein each of the first picking-conveying guide structure and the second picking-conveying guide structure comprises a tail end execution part, and the tail end execution part of the first picking-conveying mechanism and the tail end execution part of the second picking-conveying mechanism are oppositely arranged along a lifting direction and face opposite directions, thus transferring a plurality of wafers in two directions. The present invention further provides a wafer transfer method.

2 Claims, 3 Drawing Sheets

(58) Field of Classification Search
CPC ....... H01L 21/67703; H01L 21/67742–67751; H01L 21/68764; H01L 21/68707; H01L 21/6773; H01L 21/67727; H01L 21/67155; H01L 21/67161–67167; H01L 21/67184; H01L 21/67196; H01L 21/677–67706; H01L 21/67739–67745; B25J 11/0095; B23Q 1/56; B23Q 1/60; B23Q 1/606; B23Q 1/62; Y10S 901/31; C23C 14/56; C23C 14/568; C23C 16/54; G03F 7/70716
USPC ........... 269/55; 118/719; 156/345.31–345.32
See application file for complete search history.

(56) References Cited

U.S. PATENT DOCUMENTS

| | | | | |
|---|---|---|---|---|
| 2003/0082042 | A1* | 5/2003 | Woodruff | H01L 21/68707 414/744.5 |
| 2010/0239397 | A1* | 9/2010 | Irie | H01L 21/67742 700/228 |
| 2013/0121798 | A1* | 5/2013 | Hosek | H01L 21/677 414/800 |
| 2018/0102268 | A1* | 4/2018 | Sekiya | H01L 21/67288 |
| 2023/0343623 | A1* | 10/2023 | Wu | H01L 21/6838 |

* cited by examiner

WAFER TRANSFER DEVICE AND WAFER TRANSFER METHOD

CROSS-REFERENCE TO RELATED APPLICATIONS

This invention claims the priority of Chinese Patent Application No. 2021109962153 filed on Aug. 27, 2021, the entire disclosure of which is incorporated herein by reference.

FIELD OF TECHNOLOGY

The present invention relates to the field of semiconductor processing, and in particular relates to a wafer transfer device and a wafer transfer method.

BACKGROUND

A wafer transfer device, which makes a wafer be transited among all stations, is a core moving part in semiconductor processing equipment; with rapid development of the semiconductor industry, a wafer transfer technology has gradually become a key factor restricting industry development, and the performance thereof directly affects the production efficiency and manufacturing quality of the wafer. Meanwhile, with the increasing production capacity of a lithography machine, the transfer capacity of the wafer transfer device in gluing and developing equipment docked to the lithography machine needs to be continuously improved, and a transfer mode needs to be continuously optimized.

In the Chinese patent with the publication number CN102763210B, a system capable of achieving bidirectional picking and conveying of a wafer is provided. Two sliding forks for picking and conveying of the system are mutually fixed and are arranged on the same fork frame together; once the fork frame or the lower sliding fork fails and needs to be repaired or replaced, the other sliding fork also needs to be dismounted correspondingly, which prolongs shutdown time of the equipment and is not conducive to productivity improvement.

Therefore, it is necessary to develop a novel wafer transfer device and a wafer transfer method to avoid above problems in the prior art.

SUMMARY

A first objective of the present invention is to provide a wafer transfer device capable of achieving bidirectional picking and conveying of a wafer; when a picking-conveying mechanism in one direction and a supporting mechanism thereof fail and need to be replaced, the picking-conveying mechanism in one direction and the supporting mechanism thereof may be replaced separately without being affected by the picking-conveying mechanism in another direction and a supporting mechanism thereof, the maintenance time can be favorably shortened, and the production capacity is improved.

To achieve the objective, the wafer transfer device provided by the present invention comprises a first supporting mechanism and a second supporting mechanism, the first supporting mechanism and the second supporting mechanisms are arranged side by side along a translation direction, two opposite outer side walls of the first supporting mechanism and the second supporting mechanism are each provided with a picking-conveying guide structure along a telescopic direction perpendicular to the translation direction; the wafer transfer device provided by the present invention further comprises a first picking-conveying mechanism and a second picking-conveying mechanism movably arranged at the picking-conveying guide structure of the first supporting mechanism and the picking-conveying guide structure of the second supporting mechanism respectively, the first picking-conveying mechanism and the second picking-conveying mechanism each comprise a tail end execution part, the tail end execution part of the first picking-conveying mechanism and the tail end execution part of the second picking-conveying mechanism are oppositely arranged along a lifting direction and face opposite directions, and the lifting direction is perpendicular to the translation direction and the telescopic direction; the wafer transfer device provided by the present invention further comprises a picking-conveying driving part connected to the first picking-conveying mechanism and the second picking-conveying mechanism to drive the first picking-conveying mechanism to move along an arrangement direction of the picking-conveying guide structure of the first supporting mechanism and to drive the second picking-conveying mechanism to move along an arrangement direction of the picking-conveying guide structure of the second supporting mechanism.

The transfer device provided by the present invention has the beneficial effects that the first supporting mechanism and the second supporting mechanism are arranged side by side along the translation direction, the first pick-conveying mechanism and the second picking-conveying mechanism each comprise a tail end execution part, the tail end execution part of the first picking-conveying mechanism and the tail end execution part of the second picking-conveying mechanism are oppositely arranged and face opposite directions; the picking-conveying driving part is connected to the first picking-conveying mechanism and the second picking-conveying mechanism to drive the first picking-conveying mechanism to move along an arrangement direction of the picking-conveying guide structure of the first supporting mechanism and to drive the second picking-conveying mechanism to move along an arrangement direction of the picking-conveying guide structure of the second supporting mechanism, thus facilitating the two picking-conveying mechanisms to be respectively mounted on the two supporting mechanisms on the basis of achieving picking-conveying of the wafer in opposite directions; when the picking-conveying mechanism in one direction and the supporting mechanism thereof fail and need to be replaced, the picking-conveying mechanism in one direction and the supporting mechanism thereof can be replaced separately without being affected by the picking-conveying mechanism in another direction and the supporting mechanism thereof, the maintenance time can be favorably shortened, and the production capacity is improved.

Preferably, the wafer transfer device further comprises a translation driving part and a translation mechanism arranged along the translation direction; the first supporting mechanism and the second supporting mechanism are arranged on a top surface of the translation mechanism in a sliding manner; the translation driving part is connected to the first supporting mechanism and the second supporting mechanism to drive the first supporting mechanism and the second supporting mechanism to move along the translation direction. The beneficial effect thereof is that the movement of the supporting mechanism in the translation direction towards a picking-conveying position corresponding to a target wafer is achieved.

Further preferably, the wafer transfer device further comprises a translation adjusting driving part and a translation adjusting mechanism connected to each other, the translation adjusting mechanism is movably arranged at the first supporting mechanism and the second supporting mechanism along the translation direction, and opposite to a side wall of the translation mechanism, thus adjusting positions of the first supporting mechanism and the second supporting mechanism with respect to the translation mechanism along the translation direction under the control of the translation adjusting driving part. The beneficial effect thereof is that the error compensation in the translation direction is favorably achieved.

Further preferably, the translation adjusting mechanism comprises two sub translation adjusting mechanisms arranged along the translation direction, the sub translation adjusting mechanisms are movably arranged at the first supporting mechanism and the second supporting mechanism along the translation direction respectively, and are opposite to the side wall of the translation mechanism. The beneficial effect thereof is that the position compensation of the single supporting mechanism in the translation direction is favorably achieved.

Further preferably, a gap is formed between the first supporting mechanism and the second supporting mechanism along the translation direction, thus preventing the first supporting mechanism and the second supporting mechanism from colliding during operation.

Further preferably, the translation adjusting mechanism further comprises an accommodating cavity opposite to the side wall of the translation mechanism, the two sub translation adjusting mechanisms are movably arranged in the accommodating cavity, the accommodating cavity faces the side wall of the translation mechanism, and a gap is reserved between the accommodating cavity and the side wall of the translation mechanism.

Preferably, the number of the first picking-conveying mechanism is at least two, and all tail end execution parts of the at least two first picking-conveying mechanisms are sequentially arranged along the lifting direction. The beneficial effect thereof is that the transfer of a plurality of wafers in one direction is achieved.

Further preferably, the picking-conveying driving part comprises a plurality of sub picking-conveying driving parts connected to the at least two first picking-conveying mechanisms in a one-to-one correspondence manner, thus achieving independent control for each of the first picking-conveying mechanisms. The beneficial effect thereof is that transfer action can be separately achieved by any one of the plurality of picking-conveying mechanisms in one direction.

Preferably, the number of the second picking-conveying mechanism is at least two, and all tail end execution parts of the at least two second picking-conveying mechanisms are sequentially arranged along the lifting direction. The beneficial effect thereof is that the transfer of a plurality of wafers in one direction is achieved.

Further preferably, the picking-conveying driving part comprises a plurality of sub picking-conveying driving parts connected to the at least two second picking-conveying mechanisms in a one-to-one correspondence manner, thus achieving independent control for each of the second picking-conveying mechanisms. The beneficial effect thereof is that the transfer action can be separately achieved by any one of the plurality of picking-conveying mechanisms in one direction.

Preferably, the first supporting mechanism and the second supporting mechanisms are arranged on a side face of the lifting mechanism in a sliding manner; the lifting driving part is connected to the first supporting mechanism and the second supporting mechanism to drive the first supporting mechanism and the second supporting mechanism to move along the lifting direction. The beneficial effect is that the movement of the supporting mechanism in the lifting direction towards the picking-conveying position corresponding to the target wafer is achieved.

Further preferably, the wafer transfer device further comprises centering systems arranged in one-to-one correspondence to the first picking-conveying mechanism and the second picking-conveying mechanism, each centering system is connected to the translation adjusting driving part and the picking-conveying driving part to acquire position information of a wafer and to achieve offset compensation by controlling at least one of the translation adjusting driving part and the picking-conveying part according to the position information of the wafer.

Further preferably, the first supporting mechanism and the second supporting mechanism are arranged on the accommodating cavity, the lifting driving part is connected to the accommodating cavity to drive the accommodating cavity to move along the lifting direction, and then to drive the first supporting mechanism and the second supporting mechanism to move along the lifting direction.

Further preferably, the translation driving part is connected to the lifting driving part and the lifting mechanism to drive the lifting driving part and the lifting mechanism to move along the translation direction, and then to drive the first accommodating cavity, the first supporting mechanism and the second supporting mechanism to move along the translation direction.

A second objective of the present invention is to provide a wafer transfer method, which is conducive to achieve synchronous transfer of a plurality of wafers arranged in opposite directions.

To achieve the objectives, the wafer transfer method provided by the invention is achieved by means of the wafer transfer device.

DESCRIPTION OF THE EMBODIMENTS

To make objectives, technical solutions and advantages of embodiments of the present invention more clearly, the technical solutions in the embodiments of the present invention will be clearly and completely described below. Apparently, described embodiments are a part rather than all embodiments of the present invention. Based on the embodiments of the present invention, all the other embodiments obtained by those of ordinary skill in the art without creative efforts are within the scope of the present invention. Unless otherwise mentioned, all technical and scientific terms used herein have the same meaning as commonly understood by one of ordinary skill in the art to which the present invention belong. As used herein, words such as "comprising" and the like mean that elements or items appearing before the word encompass elements or items listed after the word and equivalents thereof, without excluding other elements or items.

To solve the problems in the prior art, the embodiment of the present invention provides a wafer transfer device.

Figure 1:
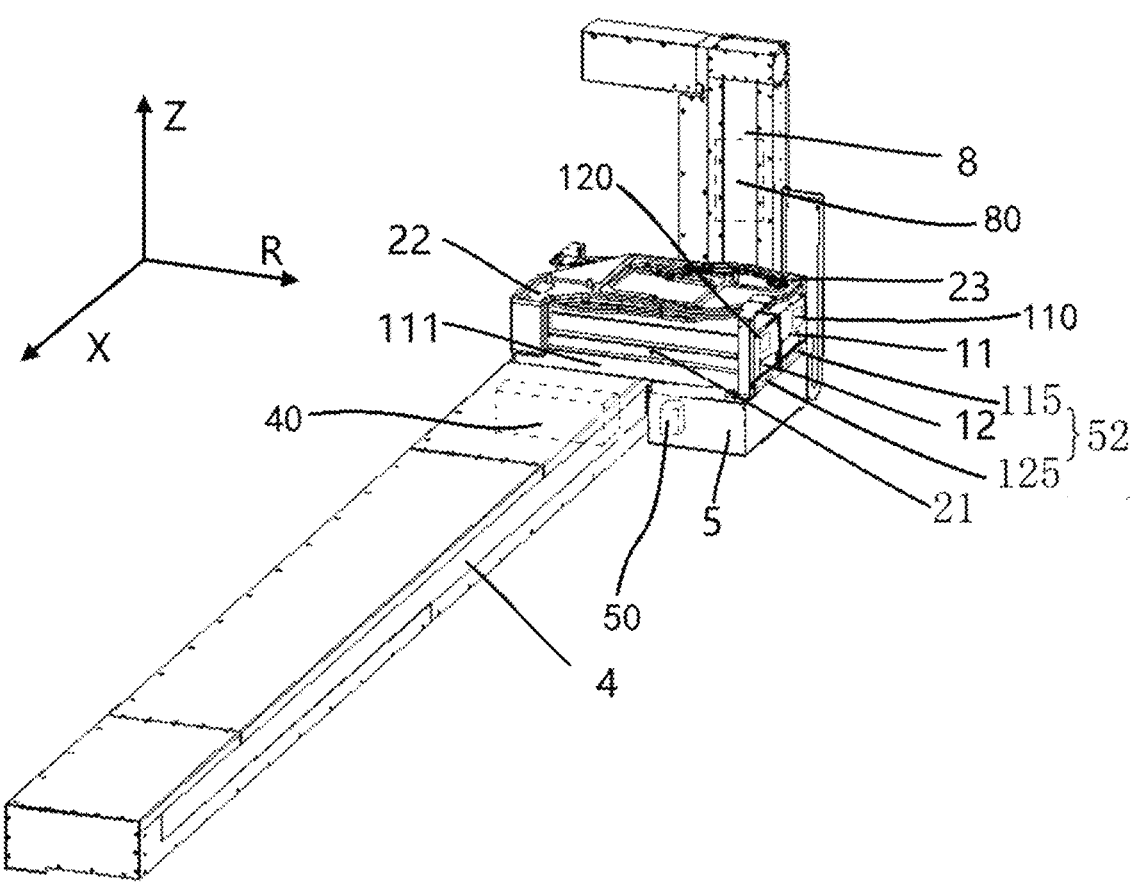
FIG. 1 is a structure diagram of a wafer transfer device in accordance with an embodiment of the present invention.
Figure 2:
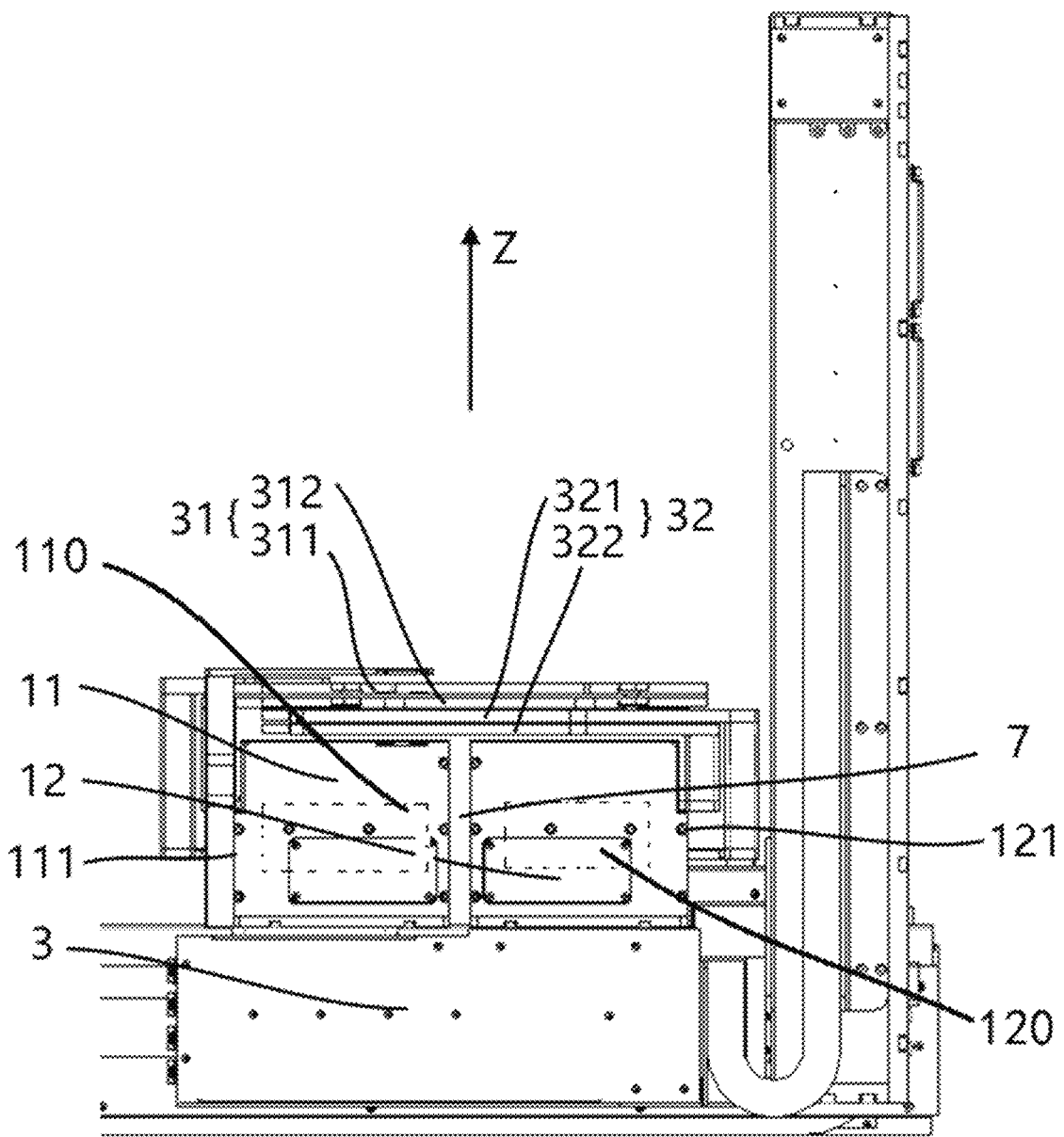
FIG. 2 is a structure diagram of a partial structure of the wafer transfer device shown in FIG. 1 along an opposite direction of R axis.
Figure 3:
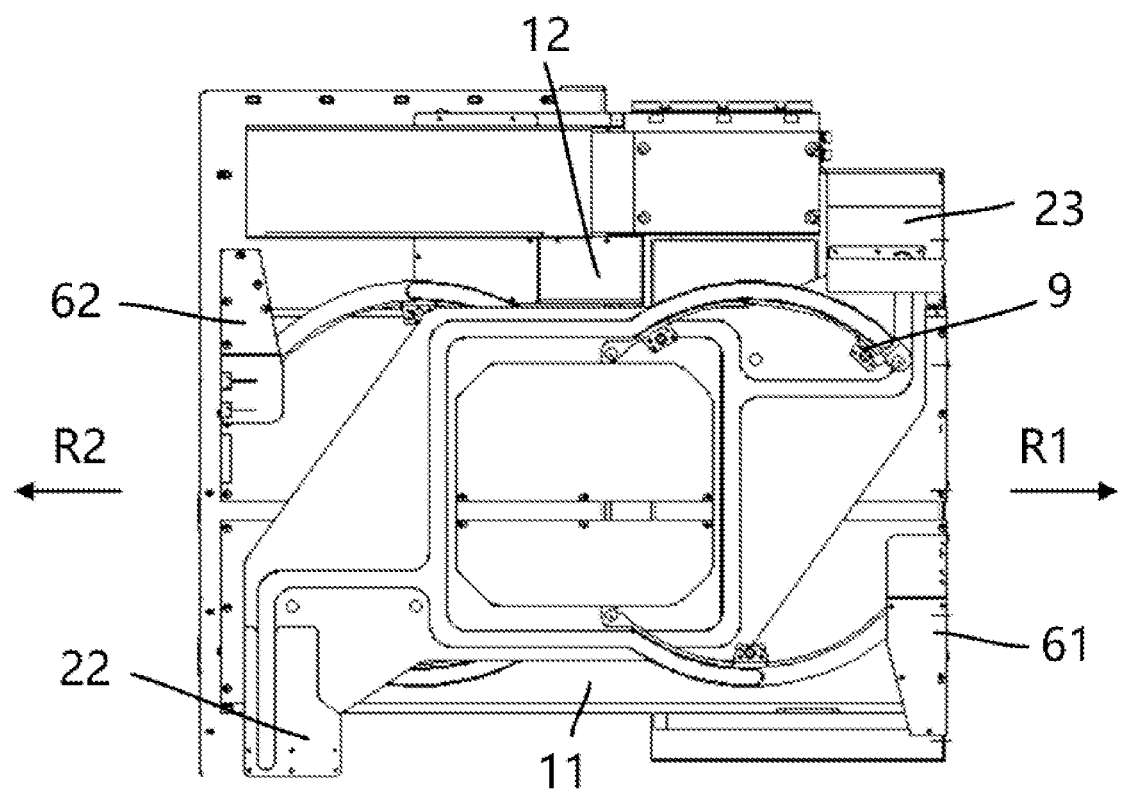
FIG. 3 is a vertical view of a partial structure of the wafer transfer device shown in FIG. 1.

FIG. 1 is a structure diagram of a wafer transfer device in accordance with an embodiment of the present invention; FIG. 2 is a structure diagram of a partial structure of the wafer transfer device shown in FIG. 1 along an opposite direction of R axis; FIG. 3 is a vertical view of a partial structure of the wafer transfer device shown in FIG. 1.

In the embodiment of the present invention, the wafer transfer device comprises a first supporting mechanism and a second supporting mechanism, the first supporting mechanism and the second supporting mechanisms are arranged side by side along a translation direction, and two opposite outer side walls of the first supporting mechanism and the second supporting mechanism are each provided with a picking-conveying guide structure along a telescopic direction perpendicular to the translation direction; the wafer transfer device further comprises a first picking-conveying mechanism and a second picking-conveying mechanism movably arranged at the picking-conveying guide structure of the first supporting mechanism and the picking-conveying guide structure of the second supporting mechanism respectively.

Specifically, referring to FIG. 1 and FIG. 2, the first supporting mechanism 11 and the second supporting mechanism 12 are arranged side by side along the translation direction, i.e., an X direction (which is interpreted as a first axis direction) shown in the figure and an opposite direction thereof; the interior of first supporting mechanism 11 and the interior of second supporting mechanism 12 are of hollow structures in which components such as motors (which is interpreted to mean each of the first supporting mechanism 11 and the second supporting mechanism 12 being of a hollow box where a first or second picking-conveying driving part 110 or 120 is accommodated therein) and communication cables are placed; a side wall surface 111 of the first supporting mechanism 11 and a side wall surface 121 of the second supporting mechanism are respectively provided with the first picking-conveying guide structure 21 and the second picking-conveying guide structure (not shown in the figure) along the telescopic direction perpendicular to the X direction shown in the figure, i.e., a R direction (which is interpreted as a second axis direction) shown in figure and an opposite direction thereof, and each picking-conveying guide structure comprises a guide rail; the wafer transfer device further comprises a first picking-conveying mechanism 22 and a second picking-conveying mechanism 23 respectively arranged in the guide rail of the first picking-conveying guide structure 21 and the guide rail of the second picking-conveying guide structure (not shown in the figure) and move along the R direction shown in the figure and an opposite direction thereof.

In some embodiments, the first picking-conveying guide structure 21 and the second picking-conveying guide structure (not shown in the figure) are arranged at same position in the lifting direction and are respectively arranged on two non-adjacent side wall surfaces of the first supporting mechanism 11 and the second supporting mechanism 12 in a way that opening directions are opposite.

In the embodiment of the present invention, the first picking-conveying mechanism and the second picking-conveying mechanism each comprise a tail end execution part, the tail end execution part of the first picking-conveying mechanism and the tail end execution part of the second picking-conveying mechanism are oppositely arranged along the lifting direction and face opposite directions, and the lifting direction is perpendicular to the translation direction and the telescopic direction.

Specifically, referring to FIG. 2 and FIG. 3, the first picking-conveying mechanism 22 comprises a first tail end execution part 31, the second picking-conveying mechanism 23 comprises a second tail end execution part 32; by taking the first tail end execution part 31 as an example, a front end of the first tail end execution part 31 is composed of two opposite arc structures (not shown in the figure) and used for bearing a wafer; a vacuum suction head 9 is arranged at a position, close to a free end, of each arc structure and is used for adsorbing and fixing the wafer.

More specifically, each arc structure is provided with a hollow structure communicated with the vacuum suction head 9 and is connected to an air extracting device to provide negative pressure. A specific implementation mode of the vacuum suction head 9 in the first picking-conveying mechanism 22 and the second picking-conveying mechanism 23 is the conventional technical means of those skilled in the art.

Referring to FIG. 2 and FIG. 3, the first tail end execution part 31 and the second tail end execution part 32 are oppositely arranged along the lifting direction, i.e., a Z direction (which is interpreted as a third axis direction) shown in the figure and an opposite direction thereof, and a gap is formed between the first tail end execution part and the second tail end execution part to prevent the first tail end execution part and the second tail end execution part from colliding during various movements. The arc structures at the front ends of the first tail end execution part 31 and the second tail end execution part 32 face opposite directions, the first tail end execution part 31 faces a R1 direction shown in the figure, and the second tail end execution part 32 faces a R2 direction shown in the figure.

The lifting direction is perpendicular to the translation direction and the telescopic direction, referring to FIG. 1, the Z direction shown in the figure is perpendicular to the X direction shown in the figure and the R direction shown in the figure.

In the embodiment of the present invention, the wafer transfer device further comprises a picking-conveying driving part, the picking-conveying driving part is connected to the first picking-conveying mechanism and the second picking-conveying mechanism to drive the first picking-conveying mechanism to move along an arrangement direction of the picking-conveying guide structure of the first supporting mechanism and to drive the second picking-conveying mechanism to move along an arrangement direction of the picking-conveying guide structure of the second supporting mechanism.

In some specific embodiments, the first supporting mechanism 11 and the second supporting mechanism 12 are both hollow cavities, the number of the picking-conveying driving part is two (which is interpreted to include the first picking-conveying driving part 110 and the second picking-conveying driving part 120), and the two picking-conveying driving parts are respectively arranged in the hollow cavities (which is interpreted to mean each of the first supporting mechanism 11 and the second supporting mechanism 12 being of a hollow box where the first or second picking-conveying driving part 110 or 120 is accommodated therein).

In some specific embodiments, the picking-conveying driving parts are arranged at the externals of the first supporting mechanism 11 and the second supporting mechanism 12 and are respectively connected to the first supporting mechanism 11 and the second supporting mechanism 12 to achieve driving control for the first supporting mechanism 11 and the second supporting mechanism 12.

In some more specific embodiments, the picking-conveying driving parts comprise two sets of driving mechanisms for respectively controlling the first picking-conveying mechanism and the second picking-conveying mechanism; each driving mechanism comprises a motor, a lead screw, and a lead screw nut seat; the two sets of driving mechanisms are arranged in opposite directions; the motor drives the lead screw to rotate, the lead screw nut seat is mounted on the lead screw to move as the lead screw rotates; the lead screw nut seat is connected to a corresponding picking-conveying mechanism and drives the picking-conveying mechanism to move.

Under the driving of the picking-conveying driving part, referring to FIG. 3, by taking the first picking-conveying mechanism 22 as an example, the first picking-conveying mechanism 22 stretches out or retracts along an arrangement direction of the first picking-conveying guide structure 21, i.e., the R1 direction shown in the figure and an opposite direction thereof.

Under one control, the two motors of the picking-conveying driving parts receive electric signals with the same content and rotate, the two lead screw nut seats move in an opposite direction at the same time to drive the first picking-conveying mechanism 22 and the second picking-conveying mechanism 23 to synchronously stretch out or retract along the opposite directions to complete the picking-conveying action.

Under another control, any one of the two motors of the picking-conveying driving parts receives an electric signal and rotates, and the lead screw nut seat corresponding to the motor moves to drive the corresponding picking-conveying mechanism to stretch out or retract to complete the picking-conveying action; however, the other picking-conveying mechanism does not perform the picking-conveying action.

in the embodiment of the present invention, the wafer transfer device further comprises a translation driving part and a translation mechanism arranged along the translation direction; the first supporting mechanism and the second supporting mechanism are arranged at a top surface of the translation mechanism in a sliding manner; the translation driving part is connected to the first supporting mechanism and the second supporting mechanism to drive the first supporting mechanism and the second supporting mechanism to move along the translation direction.

Specifically, referring to FIG. 1, the first supporting mechanism 11 and the second supporting mechanism 12 are arranged at the top surface of the translation mechanism 4 (which is interpreted as the first large-scale movement mechanism 4) in a sliding manner; the translation driving part 40 (which is interpreted as the first large-scale-movement driving member 40) is connected to the first supporting mechanism 11 and the second supporting mechanism 12 to drive the first supporting mechanism 11 and the second supporting mechanism 12 to move along the translation direction, i.e., an X direction shown in the figure and an opposite direction thereof.

In some specific embodiments, the translation driving part comprises a linear motor. The translation mechanism 4 comprises a linear guide rail, the linear motor is arranged in the linear guide rail; the first supporting mechanism 11 and the second supporting mechanism 12 are connected to the linear motor and driven by the linear motor to move.

In the embodiment of the present invention, the wafer transfer device further comprises a translation adjusting driving part (which is interpreted as a second micro-scale-movement driving member 50) and a translation adjusting mechanism (which is interpreted as a second micro-scale-movement adjusting mechanism 52) connected to each other; the translation adjusting mechanism is movably arranged at the first supporting mechanism and the second supporting mechanism along the translation direction and is opposite to a side wall of the translation mechanism, thus adjusting positions of the first supporting mechanism and the second supporting mechanism with respect to the translation mechanism along the translation direction under the control of the translation adjusting driving part.

Specifically, the translation adjusting mechanism is movably arranged at the first supporting mechanism 11 and the second supporting mechanism 12 along the X direction (which is interpreted as the first axis direction) shown in the figure and the opposite direction thereof, and is opposite to the side wall of the translation mechanism 4; the first supporting mechanism 11 and the second supporting mechanism 12 can move along the translation direction under the control of the translation adjusting driving part, i.e., the X direction shown in the figure and the opposite direction thereof, thus achieving compensation of position offset in the translation direction.

In some specific embodiments, the translation adjusting mechanism comprises a linear guide rail (which is interpreted to mean the second micro-scale-movement adjusting mechanism 52 includes a linear guide rail), the translation adjusting driving part comprises a linear motor (which is interpreted to mean the second micro-scale-movement driving member 50 includes a linear motor), the linear motor is arranged in the linear guide rail, and the linear motor is connected to the first supporting mechanism 11 and the second supporting mechanism 12 to drive the first supporting mechanism and the second supporting mechanism to move.

In the embodiment of the present invention, the translation adjusting mechanism comprises two sub translation adjusting mechanisms (which is interpreted to mean the second micro-scale-movement adjusting mechanism 52 include a first micro-scale-movement adjusting part 115 and a second micro-scale-movement adjusting part 125, and the first micro-scale-movement adjusting part 115 and the second micro-scale-movement adjusting part 125 are parts of the second micro-scale-movement adjusting mechanism 52 which includes a linear guide rail) arranged along the translation direction, the sub translation adjusting mechanisms are movably arranged at the first supporting mechanism and the second supporting mechanism along the translation direction (which is interpreted as the first axis direction), and are opposite to the side wall of the translation mechanism (which is interpreted as the first large-scale movement mechanism 4).

Specifically, the translation adjusting mechanism comprises a first sub translation adjusting mechanism (which is interpreted as the first micro-scale-movement adjusting part 115) and a second sub translation adjusting mechanism (which is interpreted as the second micro-scale-movement adjusting part 125) which are arranged along the translation direction and opposite to the side wall of the translation mechanism; the first sub translation adjusting mechanism and the second sub translation adjusting mechanism are movably arranged at the first supporting mechanism 11 and the second supporting mechanism 12 along the translation direction respectively, i.e., the X direction shown in the figure and the opposite direction thereof, to drive the first supporting mechanism 11 and the second supporting mechanism 12 respectively, thus achieving horizontal position compensation of the single supporting mechanism (which is interpreted to mean the first supporting mechanism is driven by the first micro-scale-movement adjusting part to move to a first wafer location with respect to the first large-scale movement mechanism along the first axis direction and the second supporting mechanism is driven by the second micro-scale-movement adjusting part to move to a second wafer location with respect to the first large-scale movement mechanism along the first axis direction).

In the embodiment of the present invention, a gap is formed between the first supporting mechanism and the second supporting mechanism to prevent the first supporting mechanism and the second supporting mechanism from colliding during operation.

Specifically, referring to FIG. 2, a gap 7 is reserved between two adjacent side wall surfaces of the first supporting mechanism 11 and the second supporting mechanism 12 to prevent the first supporting mechanism 11 and the second supporting mechanism 12 from colliding under the driving of the two sub translation adjusting mechanisms.

In the embodiment of the present invention, the translation adjusting mechanism further comprises an accommodating cavity opposite to the side wall of the translation mechanism, the two sub translation adjusting mechanisms are movably arranged in the accommodating cavity 5, the accommodating cavity faces the side wall of the translation mechanism, and a gap is reserved between the accommodating cavity 5 and the side wall of the translation mechanism.

Specifically, referring to FIG. 1, the accommodating cavity 5 and the side wall of the translation mechanism 4 are oppositely arranged, the two sub translation adjusting mechanisms are movably arranged in the accommodating cavity 5, the accommodating cavity 5 faces the side wall of the translation mechanism 4, and a gap is reserved between the accommodating cavity 5 and the side wall of the translation mechanism 4, thus the movement of the first supporting mechanism 11 and the second supporting mechanism 12 along the translation mechanism 4 cannot be hindered.

In the embodiment of the present invention, the number of the first picking-conveying mechanism is at least two, all tail end execution parts of the at least two first picking-conveying mechanisms are sequentially arranged along the lifting direction.

In some specific embodiments, referring to FIG. 2, the number of the first picking-conveying mechanism is two, the first tail end execution parts 311 and the second tail end execution parts 312 on the two first picking-conveying mechanisms 22 are sequentially arranged along the lifting direction, i.e., the Z direction shown in the figure and the opposite direction thereof.

In the embodiment of the present invention, the picking-conveying driving part comprises two sub picking-conveying driving parts connected to the at least two first picking-conveying mechanisms in a one-to-one correspondence manner, thus achieving independent control for each of the first picking-conveying mechanisms.

In some specific embodiments, the picking-conveying driving part comprises a plurality of sub picking-conveying driving parts connected to the at least two first picking-conveying mechanisms 22 in a one-to-one correspondence, thus achieving independent control for each of the first picking-conveying mechanisms.

In the embodiment of the present invention, the number of the second picking-conveying mechanism is at least two, and all tail end execution parts of the at least two second picking-conveying mechanisms are sequentially arranged along the lifting direction.

In some specific embodiments, referring to FIG. 1, the number of the second picking-conveying mechanism is two, the third tail end execution part 321 and the fourth tail end execution parts 322 on the two second picking-conveying mechanisms are sequentially arranged along the lifting mechanism, i.e., the Z direction shown in the figure and the opposite direction thereof.

In the embodiment of the present invention, the picking-conveying driving part comprises a plurality of sub picking-conveying driving parts connected to the at least two second picking-conveying mechanisms in a one-to-one correspondence manner, thus achieving independent control for each of the second picking-conveying mechanisms.

In some specific embodiments, the picking-conveying driving part comprises two sub picking-conveying driving parts connected to the two second picking-conveying mechanisms in a one-to-one correspondence manner, thus achieving independent control for each of the second picking-conveying mechanisms.

In the embodiment of the present invention, the wafer transfer device further comprises a lifting driving part 80 (which is interpreted as a third-axis-direction-movement driving member 80) and a lifting mechanism 8 (which is interpreted as a third-axis-direction movement mechanism 8) arranged along the lifting direction; the first supporting mechanism and the second supporting mechanism are arranged at a side face of the lifting mechanism in a sliding manner; the lifting driving part is connected to the first supporting mechanism and the second supporting mechanism to drive the first supporting mechanism and the second supporting mechanism to move along the lifting direction.

Specifically, referring to FIG. 1, the first supporting mechanism 11 and the second supporting mechanism 12 are arranged on the side face of the lifting mechanism 8 in a sliding manner; the lifting driving part (as shown in the figure) is connected to the first supporting mechanism 11 and the second supporting mechanism 12 to drive the first supporting mechanism 11 and the second supporting mechanism 12 to move along the lifting direction, i.e., the Z direction shown in the figure and the opposite direction thereof.

In some specific embodiments, the lifting driving part comprises a linear motor. The lifting mechanism 8 comprises a linear guide rail, the linear motor is arranged in the linear guide rail; the first supporting mechanism 11 and the second supporting mechanism 12 are all connected to the linear motor and driven by the linear motor to move.

In the embodiment of the present invention, the first supporting mechanism and the second supporting mechanism are arranged on the accommodating cavity; the lifting driving part is connected to the accommodating cavity to drive the accommodating cavity to move along the lifting direction, and then to drive the first supporting mechanism and the second supporting mechanism to move along the lifting direction.

Specifically, referring to FIG. 1, the first supporting mechanism 11 and the second supporting mechanism 12 are arranged at a top surface of the accommodating cavity 5; the lifting driving part (not shown in the figure) is connected to the accommodating cavity 5 to drive the accommodating cavity 5 to move along the lifting direction, i.e., the Z direction shown in the figure and the opposite direction, and then to drive the first supporting mechanism and the second supporting mechanism 12 to move along the lifting direction, i.e., the Z direction shown in the figure and the opposite direction thereof.

In the embodiment of the present invention, the translation driving part is connected to the lifting driving part and the lifting mechanism to drive the lifting driving part and the lifting mechanism to move along the translation direction, and then to drive the accommodating cavity, the first supporting mechanism and the second supporting mechanism to move along the translation direction.

Specifically, referring to FIG. 1, the first supporting mechanism 11 and the second supporting mechanism 12 are arranged at the top surface of the accommodating cavity 5, the lifting driving part (not shown in the figure) is connected to the accommodating cavity 5 to drive the accommodating cavity 5 to move along the lifting direction, i.e., the Z direction shown in the figure and the opposite direction thereof; the lifting mechanism 8 and the lifting driving part are connected to the translation driving part (not shown in the figure), the translation driving part drives the lifting mechanism 8 and the lifting driving part to move along the translation direction, i.e., the X direction shown in the figure and the opposite direction thereof, and then to drive the accommodating cavity 5, the first supporting mechanism 11 and the second supporting mechanism 12 to move along the translation direction, i.e., the X direction shown in the figure and the opposite direction thereof.

In another embodiments, referring to FIG. 1, the first supporting mechanism 11 and the second supporting mechanism 12 are arranged at the top surface of the accommodating cavity 5, the translation driving part (not shown in the figure) is connected to the accommodating cavity 5 to drive the accommodating cavity 5 to move along the translation direction, i.e., the X direction shown in the figure and the opposite direction thereof; the translation mechanism 4 and the translation driving part are connected to the lifting driving part (not shown in the figure), the lifting driving part drives the translation mechanism 4 and the translation driving part to move along the lifting direction, i.e., the Z direction shown in the figure and the opposite direction thereof, and then to drive the accommodating cavity 5, the first supporting mechanism 11 and the second supporting mechanism 12 to move along the lifting direction, i.e., the Z direction shown in the figure and the opposite direction thereof.

In the embodiment of the present invention, the wafer transfer device further comprises centering systems arranged in one-to-one correspondence to the first picking-conveying mechanism and the second picking-conveying mechanism, and each centering system is connected to the translation adjusting driving part and the picking-conveying driving part to acquire position information of a wafer and to achieve offset compensation by controlling at least one of the translation adjusting driving part and the picking-conveying driving part according to the position information of the wafer.

Specifically, referring to FIG. 3, the first centering system 61 and the second centering system 62 are arranged in one-to-one correspondence to the first picking-conveying mechanism 22 and the second picking-conveying mechanism 23; the first centering system 61 and the second centering system 62 are connected to the translation adjusting part and the picking-conveying driving part to acquire the position information of the wafer and to achieve offset compensation by controlling the translation adjusting driving part or the picking-conveying driving part or simultaneously controlling both the translation adjusting driving part and the picking-conveying driving part according to the position information of the wafer. The specific implementation modes of the first centering system 61 and the second centering system 62 are the conventional technical means of those skilled in the art.

The embodiment of the present invention further provides a wafer transfer method which is achieved by means of the wafer transfer device.

Specifically, the wafer transfer method is achieved by means of the wafer transfer device.

While the embodiments of the present invention have been described in detail, it will be apparent to those skilled in the art that various modifications and changes can be made to the embodiments. However, it should be understood that such modifications and variations are within the scope and spirit of the present invention as described in the appended claims. Furthermore, the present invention described herein is susceptible to other embodiments and may be embodied or carried out in various ways.

What is claimed is:

1. A wafer transfer device comprising:
a first supporting mechanism and a second supporting mechanism, wherein the first supporting mechanism and the second supporting mechanisms are arranged side by side along a first axis direction from a front wall of the first supporting mechanism towards a back wall of the second supporting mechanism, each of the first supporting mechanism and the second supporting mechanism being of a hollow box where a first or second picking-conveying driving part is accommodated therein, respectively, wherein the first supporting mechanism and the second supporting mechanism each is configured to extend along a second axis direction perpendicular to the first axis direction;
wherein the front wall of the first supporting mechanism and the back wall of the second supporting mechanism are each provided with a picking-conveying guide rail configured to extend along the second axis direction of the first supporting mechanism and the second supporting mechanism;
a first picking-conveying mechanism and a second picking-conveying mechanism movably arranged at the picking-conveying guide rail of the first supporting mechanism and the picking-conveying guide rail of the second supporting mechanism respectively;
wherein the first picking-conveying mechanism and the second picking-conveying mechanism each comprise a tail end execution part, the tail end execution part of the first picking-conveying mechanism and the tail end execution part of the second picking-conveying mechanism are overlapped along a third axis direction with a gap therebetween to prevent collision and adapted to pick and convey wafers adjacent opposite lateral walls of the first supporting mechanism and the second supporting mechanism, wherein the third axis direction is perpendicular to a plane defined by the first axis direction and the second axis direction;
wherein the first and second picking-conveying driving parts are coupled to the first picking-conveying mechanism and the second picking-conveying mechanism respectively to drive the first picking-conveying mechanism to move along the second axis direction of the picking-conveying guide rail of the first supporting mechanism and to drive the second picking-conveying mechanism to move along the second axis direction of the picking-conveying guide rail of the second supporting mechanism; and wherein the wafer transfer device further comprises a first large-scale-movement driving member and a first large-scale movement mechanism configured to extend along the first axis direction;

the first supporting mechanism and the second supporting mechanism are arranged at a top surface of the first large-scale movement mechanism in a sliding manner;

wherein the first large-scale-movement driving member is coupled to the first large-scale movement mechanism so as to drive both of the first supporting mechanism and the second supporting mechanism to move to a common wafer-buffer area along the first axis direction;

wherein the wafer transfer device further comprises a second micro-scale-movement driving member and a second micro-scale-movement adjusting mechanism coupled to each other, the second micro-scale-movement adjusting mechanism including a first micro-scale-movement adjusting part and a second micro-scale-movement adjusting part disposed on the first supporting mechanism and the second supporting mechanism along the first axis direction respectively, the second micro-scale-movement driving member is coupled to the first micro-scale-movement adjusting part and the second micro-scale-movement adjusting part such that the first supporting mechanism is driven by the first micro-scale-movement adjusting part to move to a first wafer location with respect to the first large-scale movement mechanism along the first axis direction and the second supporting mechanism is driven by the second micro-scale-movement adjusting part to move to a second wafer location with respect to the first large-scale movement mechanism along the first axis direction;

wherein the first large-scale movement mechanism has a mechanism side-wall configured to extend along the first axis direction, an accommodating cavity is configured to have a cavity side-wall disposed adjacent and spaced from the mechanism side-wall of the first large-scale movement mechanism, and the first micro-scale-movement adjusting part and the second micro-scale-movement adjusting part are accommodated within the accommodating cavity;

wherein the wafer transfer device further comprises a third-axis-direction movement mechanism arranged along the third axis direction and a third-axis-direction-movement driving member in the third-axis-direction movement mechanism, the third-axis-direction movement mechanism has a side face thereof, and the first supporting mechanism and the second supporting mechanism are arranged on the side face of the third-axis-direction movement mechanism in a sliding manner;

the third-axis-direction-movement driving member is further coupled to the first supporting mechanism, the second supporting mechanism and the accommodating cavity so as to drive the first supporting mechanism, the second supporting mechanism and the accommodating cavity to move along the third axis direction;

wherein the first large-scale-movement driving member is further coupled to the third-axis-direction-movement driving member and the third-axis-direction movement mechanism to drive the third-axis-direction-movement driving member and the third-axis-direction movement mechanism to move along the first axis direction such that the accommodating cavity, the first supporting mechanism and the second supporting mechanism by coupling to the third-axis-direction-movement driving member and the third-axis-direction movement mechanism can be driven to move along the first axis direction.

2. The wafer transfer device according to claim 1, wherein a space is formed between the first supporting mechanism and the second supporting mechanism along the first axis direction, thus preventing the first supporting mechanism and the second supporting mechanism from colliding during operation.

\* \* \* \* \*